(12) United States Patent
Lindau et al.

(10) Patent No.: US 8,312,393 B2
(45) Date of Patent: Nov. 13, 2012

(54) VARIABLE OVERLAP METHOD AND DEVICE FOR STITCHING TOGETHER LITHOGRAPHIC STRIPES

(75) Inventors: Sten Lindau, Taby (SE); Torbjörn Sandström, Pixbo (SE); Anders Osterberg, Taby (SE); Lars Ivansen, Solna (SE)

(73) Assignee: Micronic Laser Systems AB (SE)

( * ) Notice: Subject to any disclaimer, the term of this patent is extended or adjusted under 35 U.S.C. 154(b) by 330 days.

(21) Appl. No.: 12/718,900

(22) Filed: Mar. 5, 2010

(65) Prior Publication Data
US 2010/0229146 A1    Sep. 9, 2010

Related U.S. Application Data

(60) Provisional application No. 61/158,310, filed on Mar. 6, 2009.

(51) Int. Cl.
*G06F 17/50* (2006.01)
(52) U.S. Cl. .......................................... 716/50; 716/54
(58) Field of Classification Search .................. 716/50, 716/54
See application file for complete search history.

(56) References Cited

U.S. PATENT DOCUMENTS

| | | | |
|---|---|---|---|
| 7,158,280 B2 | 1/2007 | Sandstrom | |
| 7,410,736 B2 * | 8/2008 | Bleeker et al. | 430/30 |
| 7,564,535 B2 * | 7/2009 | Ishii | 355/67 |
| 8,089,616 B2 * | 1/2012 | Owa | 355/77 |
| 2005/0068467 A1 | 3/2005 | Bleeker et al. | |
| 2005/0094246 A1 | 5/2005 | Roberts | |
| 2006/0181758 A1 | 8/2006 | Willis | |
| 2007/0127109 A1 | 6/2007 | Ishii | |
| 2010/0099049 A1 | 4/2010 | Owa et al. | |

FOREIGN PATENT DOCUMENTS

WO    2009/011119 A1    1/2009

OTHER PUBLICATIONS

International Search Report and Written Opinion, Application No. PCT/EP2010/052865, mailed Aug. 27, 2010.

* cited by examiner

*Primary Examiner* — Thuan Do
*Assistant Examiner* — Magid Dimyan
(74) *Attorney, Agent, or Firm* — Haynes Beffel & Wolfeld, LLP; Ernest J. Beffel, Jr.

(57) ABSTRACT

The technology disclosed relates to variable tapers to resolve varying overlaps between adjacent strips that are lithographically printed. Technology disclosed combines an aperture taper function with the variable overlap taper function to transform data and compensate for varying overlaps. The variable taper function varies according to overlap variation, including variation resulting from workpiece distortions, rotor arm position, or which rotor arm printed the last stripe. Particular aspects of the present invention are described in the claims, specification and drawings.

12 Claims, 4 Drawing Sheets

VARIABLE OVERLAP METHOD AND DEVICE FOR STITCHING TOGETHER LITHOGRAPHIC STRIPES

RELATED APPLICATION

This application claims the benefit of U.S. Provisional Application No. 61/158,310, filed 6 Mar. 2009, which is hereby incorporated by reference.

This application is related to U.S. patent application Ser. No. 12/718,883, entitled "Rotor Optics Imaging Method and System with Variable Dose During Sweep"; and U.S. patent application Ser. No. 12/718,895, entitled "Rotor Imaging System and Method with Variable-Rate Pixel Clock"; U.S. patent application Ser. No. 12/718,903, entitled "Lithographic Printing System with Placement Corrections"; and U.S. patent application No. Ser. 12/718,904 entitled "Illumination Methods and Devices for Partially Coherent Illumination"; all filed contemporaneously. The related applications are incorporated by reference.

This application is also related to U.S. patent application Ser. No. 12/706,624, entitled "Improved SLM Device and Method", filed 16 Feb. 2010. The related application is incorporated by reference.

BACKGROUND OF THE INVENTION

The technology disclosed relates to variable tapers to resolve varying overlaps between adjacent strips that are lithographically printed. Technology disclosed combines an aperture taper function with the variable overlap taper function to transform data and compensate for varying overlaps. The variable taper function varies according to overlap variation, including variation resulting from workpiece distortions, rotor arm position, or which rotor arm printed the last stripe.

This design team recently has described in patent applications of rotor arm scanning system with very high throughput. The rotor arm scanner can, for instance, be used to write directly to large area masks.

The use of the rotor arm for scanning, instead of a shuttlecock with a reciprocating motion or a fixed head and a moving bed, is a radical departure from standard lithographic and imaging equipment. Use of the rotor presents very challenging data path issues, as the data is presented in a Cartesian grid that requires translation or mapping for use in a polar scanning system, in which the actual scanning path also involves linear motion of the workpiece as the scanning arm rotates.

Accordingly, many new components of a data path need to be developed. Many new problems not presented by prior lithographic technologies need to be identified and solved. Resolution of the many constituent engineering challenges has the potential of contributing to an overall system that has many times the pixel and area coverage throughput of prior, reciprocating systems.

SUMMARY OF THE INVENTION

The technology disclosed relates to variable tapers to resolve varying overlaps between adjacent strips that are lithographically printed. The technology disclosed combines an aperture taper function with the variable overlap taper function to transform data and compensate for varying overlaps. The variable taper function varies according to overlap variation, including variation resulting from workpiece distortions, rotor arm position, or which rotor arm printed the last stripe. Particular aspects of the present invention are described in the claims, specification and drawings.

DETAILED DESCRIPTION

The following detailed description is made with reference to the figures. Preferred embodiments are described to illustrate the present invention, not to limit its scope, which is defined by the claims. Those of ordinary skill in the art will recognize a variety of equivalent variations on the description that follows.

Variable Overlap

The technology disclosed applies a variable taper function to resolve varying overlaps between adjacent strips that are lithographically printed. Possible causes of varying overlaps between adjacent strips include: distortion of workpiece; projection of a constant orientation of the image as a rotor printing system sweeps an arc; and use of a multiple arm rotor printing system with variations among the rotor arms. Distortion of a workpiece may force a multilayer printing process to follow a previously established pattern that no longer matches the Cartesian grid. In a rotor system, projection of the constant orientation of the image during the sweep of the rotor arm produces a stroke like a calligraphy pen that varies in width, depending on the sweep of the pen relative to the orientation of the pen tip. A rotor system has a wider overlap region at the 12 o'clock position than at 10:30 or 1:30. A multi-arm rotor system may have arms of slightly different lengths, so that the overlap between successive printing passes of arms one and two is different than the overlap between successive passes of arms two and three.

The technology disclosed combines an aperture taper function with the variable overlap taper function to transform data and compensate for varying overlaps. The variable taper function varies according to overlap variation, including variation resulting from workpiece distortions, rotor arm position, or which rotor arm printed the last stripe.

Figure 3:
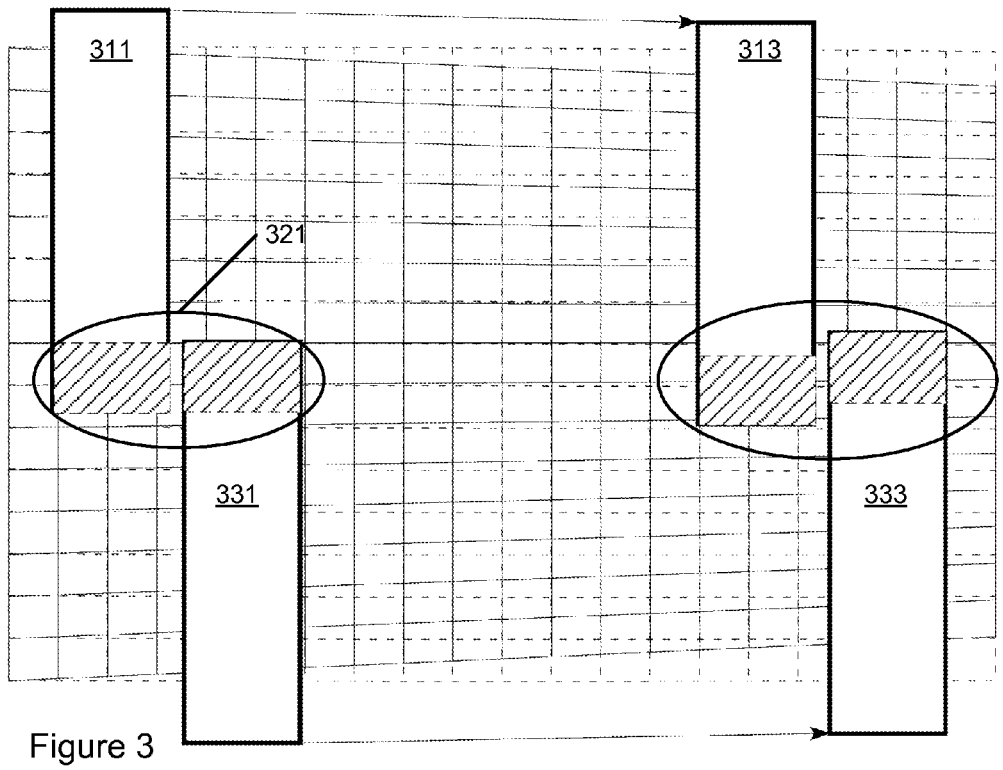
FIG. 3 depicts the basic structure of the distorted workpiece problem.

FIG. 3 depicts the basic structure of the distorted workpiece problem. In this figure, the ideal grid is depicted by dotted lines and the distorted workpiece by solid lines. As a printing head follows a path that tracks the middle of a printed bar to the actual, distorted grid of the workpiece, the overlap between adjacent stripes changes. In the figure, portions of two stripes are represented by rectangles 311 and 331. The overlap between the stripes is a shaded area 321. Following the solid lines of the actual grid, the middle of rectangle 311 translates to the position 313. The middle of rectangle 331 translates to position 333. It is apparent that the overlap 321 between translated rectangles 313 and 333 is greater than the overlap between the original rectangles 311 and 331.

Figure 4A:
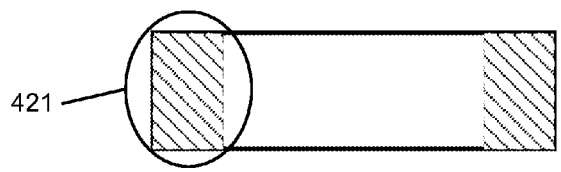
FIGS. 4a-b depict the desired data for rectangles on the left and right sides of FIG. 3.
Figure 4B:
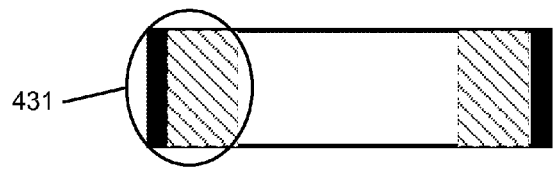

FIGS. 4*a*-*b* depict the desired data for rectangles on the left and right sides of FIG. 3. FIG. 4*a* corresponds to rectangles 311, 331. A tapered overlap 421 is appropriate for both the rectangles, as the deeper zones appear not to overlap with the full illumination zones of the rectangles. FIG. 4*b* corresponds to rectangles 313, 333, which have an excessive overlap. Accordingly, the taper zone 431 includes a darkly shaded area that should not relay any illumination onto the workpiece. This darkly shaded area is where an intended taper overlaps with a fully illuminated section of the adjacent stripe.

Figure 5:
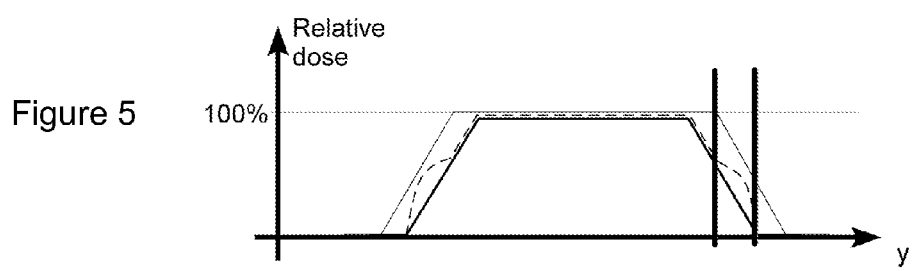
FIG. 5 depicts a tapered aperture that is wider than needed.

The combination of a tapered aperture and a variable taper function can be applied to variable overlaps. (In the degenerate case of an untapered aperture, the variable taper function can be applied by itself) FIG. 5 depicts the transfer function for a tapered aperture that is slightly oversized, adapted to be combined with a varying taper function to handle varying overlaps. The outside trapezoid represents the tapered aperture. The inside trapezoid represents the desired latent image on the workpiece. In the absence of a tapered aperture, data might be fed to a modulator to generate the inner trapezoid directly. However, the resolution of modulators is finite and stepped. Therefore, it is useful to have a tapered aperture that presents a smoother and more gradual taper than can be achieved with just the modulator. In the presence of a tapered aperture, the data between the two vertical lines will take on a higher value than it would in the absence of the tapered aperture. The combination of the data indicated by the dotted line and the tapered edge aperture indicated by the outer trapezoid produces the exposure on the workpiece indicated by the inner trapezoid.

In real-time calculations, a first aperture function represents the tapered aperture and a second variable taper function varies according to overlap of successive stripes and taper required to modify exposure from the successive steps to handle the overlap. Calculation and updating of the variable taper function is responsive to the origin of the overlap. Overlap resulting from distortion may be sensed in real-time to update the variable taper function. Or, distortion may be mapped in one pass and the map used to derive the variable taper function for a writing pass. Mixing the two possibilities, multiple writing passes may be used and the data used for a first writing pass reused in successive writing passes, especially when the distortion is caused by a prior process step or mounting of the workpiece on the stage.

Figure 6:
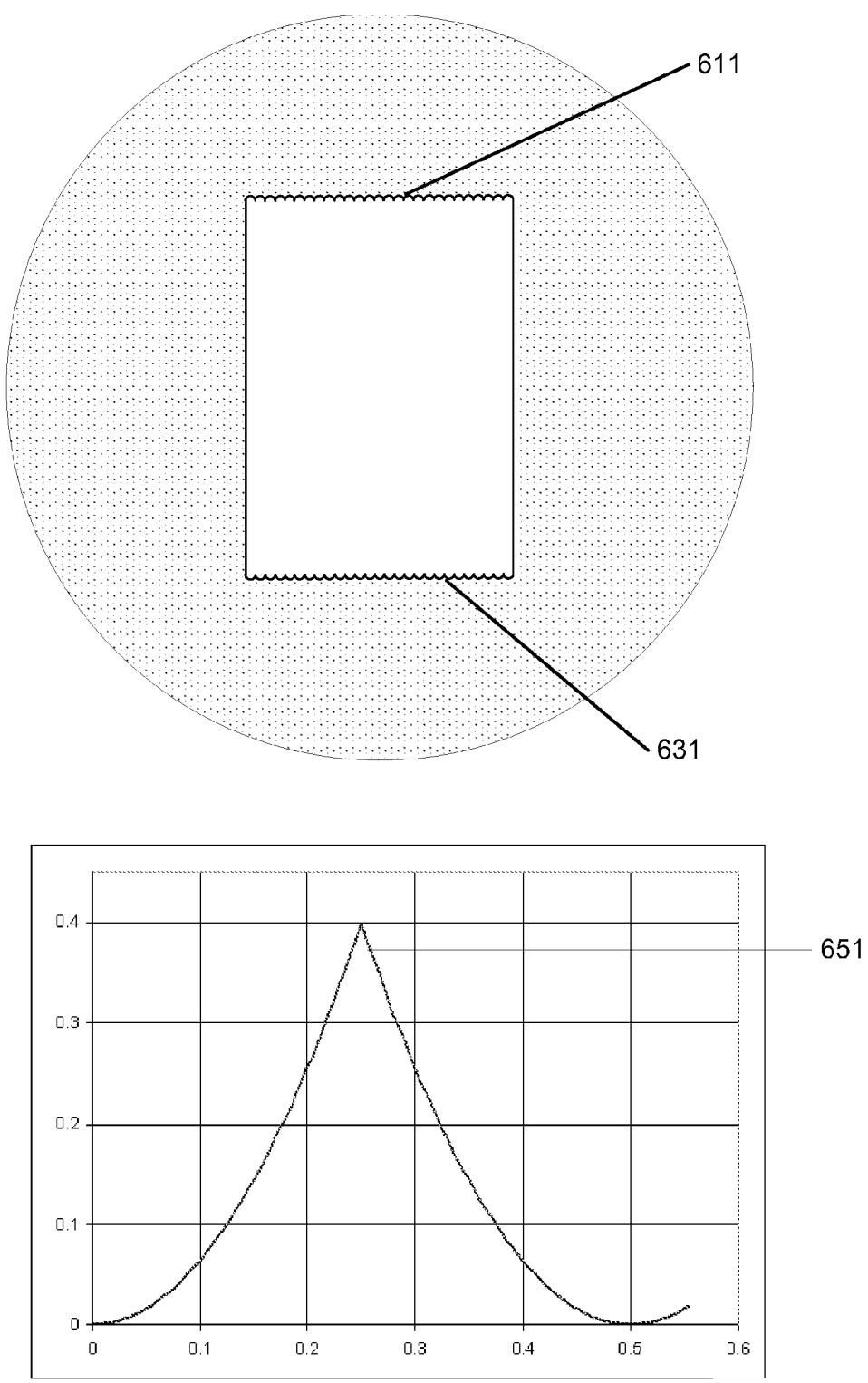
FIG. 6 illustrates a tapered aperture that uses scallops along edges to taper the illumination of the SLM or of relayed radiation from the SLM.

At least three kinds of tapered apertures could be used. One type of tapered aperture uses dots or phase shifting structures on a clear filter to transmit varying amounts of light. A second type of tapered capture, illustrated in FIG. 6, uses scallops along tapered edges to vary the illumination of the SLM or the transmission of radiation from the SLM to workpiece. In FIG. 6, scallops are apparent along top and bottom edges 611, 631. Detail of one aperture edge shape the can be used to produce a tapered aperture is depicted in curve 651. Yet another approach is to vary illumination across the aperture, as described in our application entitled "Illumination Methods and Devices for Partially Coherent Illumination," which has been incorporated by reference.

Using the technology disclosed, the problem of compensating for a measured distortion of a workpiece during build-up of multiple layers in a writing strategy using a 1D SLM is solved using a tapered aperture in projection optics with tapered transmission in overlap zones, with transmission in the overlap zones that exceeds transmission required. Data that specifies relative locations of adjoining stripes, reflecting the measured distortion of the workpiece and the varying displacement between the adjoining stripes. A taper computing module computes a taper function between adjoining stripes, based on their relative locations and characteristics of the tapered aperture. An SLM data correction module that applies the taper function to pattern data to produce data for an SLM.

Frame Tapering Compensation (FTC)

FTC is the "dose adjustment over stamp/modulator" compensation. It is a multiplicative function that adjusts the illumination value after the Grey-scaling Compensation. Its primary use is for overlap adjustment.

In the Sigma machine produced by Micronic Laser Systems, a so-called, "black border" is implemented as FTC. For Sigma, the FTC is the same for all stamps in an entire exposure. This is not the case for the technology disclosed herein, where the FTC varies over the "scan strip". The FTC compensates for a varying overlap. The "trajectory" for different arms varies and consequently, the overlap region also varies. However, it will be the same for each "scan strip" with the same arm in a given configuration. Two arm, three or four arm writing will have different FTC maps.

Two different types of mappings can be used: Modulator (SLM) local (with a 1D SLM wrier) and Strip local. It is assumed that a piecewise linear mapping is sufficient for describing the type of tapering functions to implement. However, the precision in positioning the vertices in the piecewise description needs accuracy down to single pixel level. So if a uniform grid was to be used, every single MPM pixel would have to be in the map. Since a uniform grid is undesirable, a mapping is used where coordinates are dynamically defined. For strip local, mapping a fixed grid is assumed to be sufficient to use.

Linear interpolation is assumed between the strip local mapping positions. We want to map the following ($SLM_x$, $SLM_y$, $S_x$, $Ill_a$):

$M_x$—Modulator (SLM) local X position
$M_y$—Modulator (SLM) local Y position
$S_x$—Strip local X position
$I_a$—Illumination compensation factor ([0 . . . 1])

In order to map the aforementioned positions and factor, we desire usage of the CS Maps' ability to carry several data values in each data point. $M_x$, $M_y$, and $I_a$ are making up "data triplets" used as map data points. For mapping the different FTC shape over the "scan strip", several maps are used in the same file and $S_x$ is going into the header to define that validity position of that map.

The mapping over strip local X position could also be used for "dose over strip" compensation if allowed by SLM contrast.

EXAMPLE

In the example below, the FTC is mapped at four X positions (X1 . . . X4) for a "scan strip". The FTC shape is different at each position. N.B. The shape depicted is not in any way typical. At each position the illumination compensation factor can be plotted as a function of SLM local position in Y.

The Pseudo algorithm for $I_a$ value calculation of arbitrary MPM pixel is as follows. First, look at MPM pixel X position and find the nearest map to the left and the nearest map to the right in the csm14 file. Second, if only one map is found, i.e. the maps do not span the entire scan strip, the outermost map is extended to be valid until end of strip. In this way it is possible to set the same map for an entire strip with just one map, say placed at x=0. Third, find the MPM local Y position for the two map sets (found in #1). Fourth, find the upper and lower nearest MapData point in local Y. Fifth, apply the same special case as for maps, if the outermost data point is extended to be valid also outside its position. In this way it is possible to give one $I_a$ value for the entire SLM with just one point. Sixth, do linear interpolation for the compensation factor between the two points found above, based on local Y position. Seventh, do linear interpolation for the compensation factor between the two values calculated above based on MPM X position. Finally, the result will be used for multiplying the MPM pixel illumination value.

Rotor Optics

Environments in which the technology disclosed is particularly useful include a rotating arm printing or viewing device with relay optics with a hub at one end of the arm and optics at the other end, which couple image information with the surface of a workpiece. The optical coupling at the hub may be either on or off the axis of rotation. The following section provides background on the inventive rotor system that is useful for understanding the role of a variable dose or dose compensation function.

A rotor arm system can write to (or read from) a workpiece. It uses a stationary optical image device to modulate (or collect) relayed image information. It relays the image information along optics of at least one rotating arm between the stationary optical image device and a surface of the workpiece. By repeatedly sweeping a curved stripe across the surface of the workpiece, a contiguous image may be written from overlapping partial images by stitching together the partial images on the workpiece.

Pattern information, e.g., a partial image, is relayed between the optical image device and the surface of the workpiece with a substantially constant azimuthal orientation. By "substantially constant," we include a small rotation that is within tolerances or that is corrected in rasterizing, producing no more than a 0.5 degree rotational variation in the angular relationship when the relayed versions are separated by more than 5 degrees sweep of the rotating optical arm.

The rotor can have several arms, e.g. 2, 3, 4, 6, or 8 arms, thereby multiplying the scanned surface area per time unit. Heavy, complex, fragile machine parts, or parts that are expensive or need many connections and services can be placed stationary near the center or hub of the rotor and be shared by the multiple arms. An image is relayed between a stationary image device placed at or near the hub of the rotor and the workpiece, through the radial arm.

The rotor system is described by reference to relay optics because it can be used to write to or read from a workpiece. For instance, it is useful to write directly to a large area mask or a PCB. Or, it can be used to inspect a large area mask. It is used with a workpiece positioning mechanism, such as a stage, details of which are outside the scope of this disclosure.

Figure 1:
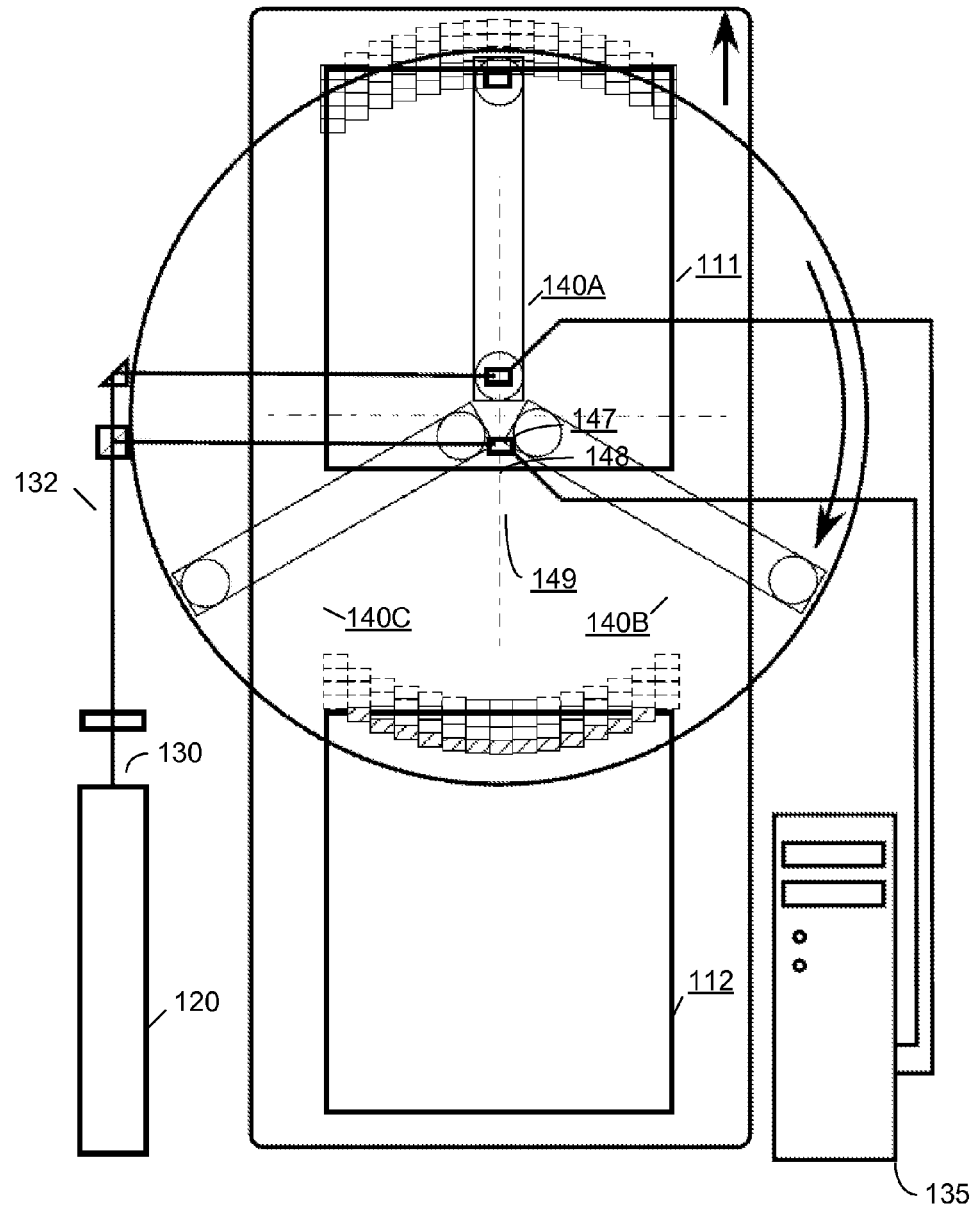
FIG. 1 depicts a scanning system with three arms and a pair of workpieces 111, 112 being written on opposite sides of the hub 148.

FIG. 1 depicts a rotor scanning system with three arms and a pair of workpieces 111, 112 being written on opposite sides of the hub 148. This system may have a duty cycle of 100%. Each rotor writes through an arc of 60 degrees. Only one arm 140 writes at a time, alternatively on the two workpieces 111 and 112. The laser energy is switched by polarization control 132 between the two SLMs 147 and 149, and the data stream is also switched between the SLMs. Since the laser 120 and the data path 135 are among the most expensive modules in a writing machines, this embodiment has been designed to use laser and data channel 100% of the time while the SLMs and the optics in the arms have lower duty cycles, 50% and 33% respectively. This may be, for instance, an example of a writing system with three rotating arms 140A-C. There are a variety of alternative designs for these arms and the relay optics. The figure conceptually depicts a laser 120 and a controller 135 sending data to two SLMs 130 which are relayed 132, 147, 149 to the rotating arms. It shows how each arm moves in front of each SLM and writes a series of concentric stamps on the workpieces 111, 112. While two workpieces are shown in this figure, more workpieces could be positioned under a rotor, depending on its size. While the example is described as a writing system, the direction of relay could just as easily be from the workpiece back to a pair of detectors positioned where the laser 120 is and elsewhere. In alternative configurations, one workpiece might be used; four arms might be used.

Some particularly useful applications of this technology involve writing patterns on electronic substrates, such as: wafers' front and back sides; PCBs; build-up, interposer and flexible interconnection substrates; and masks, stencils, templates and other masters. Likewise, the rotor writer can be used for patterning panels in displays, electronic paper, plastic logic and photovoltaic cells. The patterning can be done by exposure of photoresist, but also through other actions of light such as thermal or photochemical processes: melting, evaporation, ablation, thermal fusing, laser-induced pattern transfer, annealing, pyrolytic and photo induced etching and deposition.

A rotor system replaces the customary motion of a Cartesian flatbed xy stage with a polar scanning motion. Potential benefits include high throughput, low cost and mechanical simplicity. The scanning action is done by a rotating motion, which is mechanically easier to build to high accuracy than straight-line motion. The position accuracy of a point on the periphery of the rotor is determined by the quality of a bearing and the accuracy of an angle encoder. Both of these components can be sourced with high quality. A rotational bearing reduces vibrations and transient forces during scanning and between scanning strokes. A well-balanced rotor emits essentially no vibrations or reactive forces to the supporting structure, while reciprocating straight movements need to reverse their momentum twice per stroke and create strong disturbances when doing so. A rotor may have a higher scanning velocity with less mechanical overhead. A rotor with several arms uses nearly the whole circle for writing. For instance, a rotor with four arms may scan through an 80 degree arc. Out of the 360 degrees in a circle, the rotor scans during 4×80=320 degrees. A reciprocating movement needs more mechanical overhead. The overhead for reciprocating movement gets larger with increased scanning velocity.

Rotor systems may have a very high data rate and throughput and may be used for other types of patterning where these characteristics are useful: photo-setting, printing, engraving, security marking, etc. The rotor has a smooth movement and small mechanical overhead even at high rotation speeds, e.g. 60, 120, 300, 600 r.p.m. or higher. The scanning speed, which is the peripheral speed of the rotor, may be higher than comparable reciprocating systems, e.g. 2, 4, 8, 20 m/s or higher.

In practical terms, one implementation would have a rotor one meter in diameter, spinning 3.3 turns per second with a centripetal acceleration of 20 g. The acceleration force gives a constant force on rotating components, such that a lens weighing 50 grams will feel a constant force outwards of 10 N. With four arms and rotational speed, the system writes 13 strokes per second with a peripheral velocity of 10 m/s, a mechanical speed that is impractical with a reciprocating stage. Furthermore, with proper balancing and design of the bearings the motion will be smooth, have high mechanical precision and need little power to be sustained. If the image generator is a micromechanical 1D SLM with constant 2 MHz frame rate used for creating a 1D partial image on the workpiece, the reloading of the SLM would occur every 5 microns along the scanning direction and the pixel size could be 5×5 microns, allowing line width of less than 15 microns to be written. With a micromechanical 1D SLM, effectively having 8000×1 pixels, each stroke would fill a stripe 40 mm wide with pattern, and cover—with some reduction for the non-straight scan—0.3 square meters per second or 20 square meters per minute. This is a very high coverage rate, compared to other writing technologies.

Figure 2:
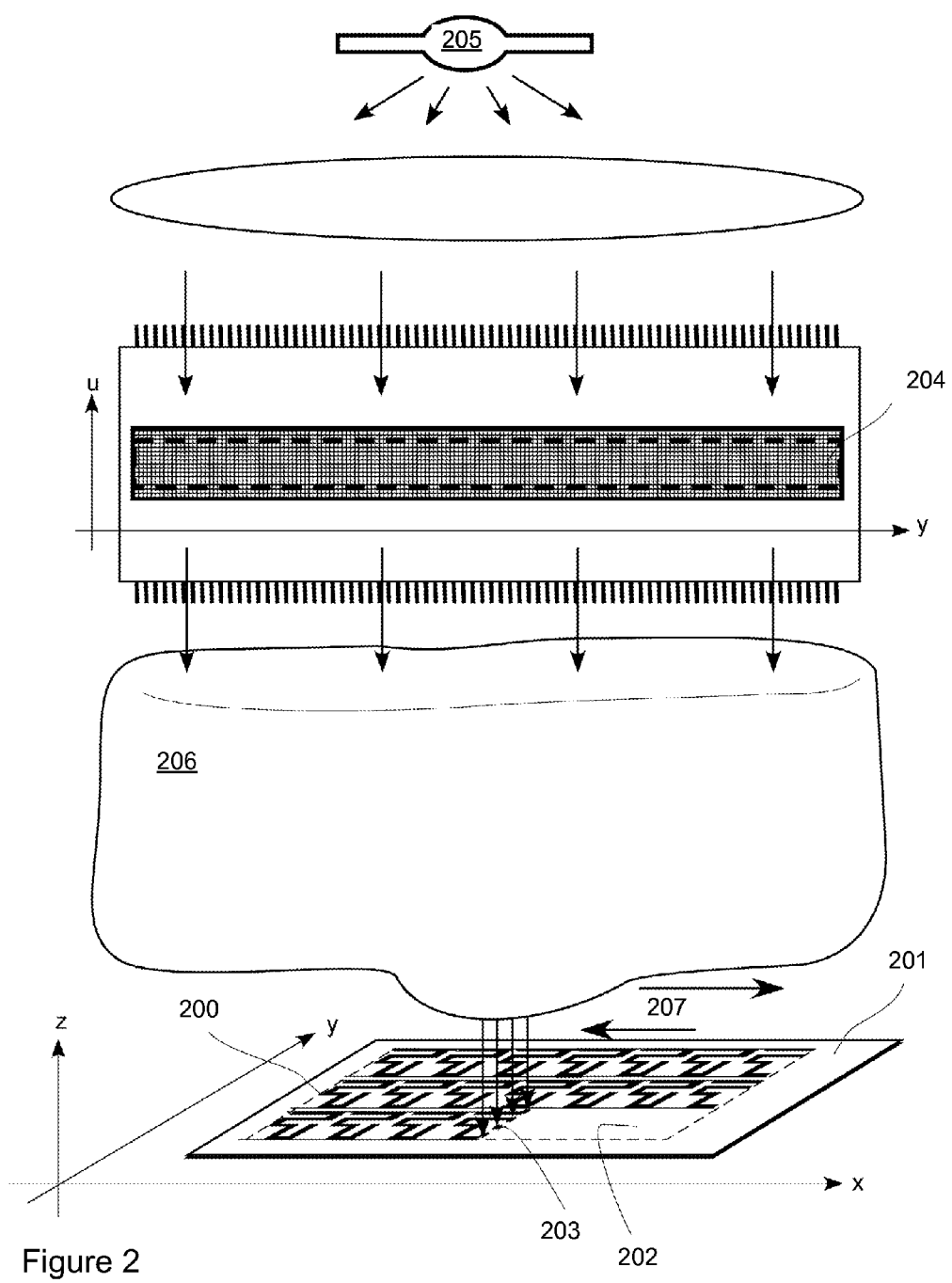
FIG. 2 further describes use of a so-called one-dimensional SLM with anamorphic optics.

FIG. 2 further describes use of a so-called one-dimensional SLM with anamorphic optics. A light source 205 (arc lamp, gas discharge, laser, array of lasers, laser plasma, LED, array of LEDs etc.) illuminates a one-dimensional SLM 204. The reflected (or transmitted in the general case) radiation is projected as a line segment 203 on a workpiece 201. The data driving the SLM changes as the workpiece is scanned 207 to build up an exposed image. A strongly anamorphic optical system 206 concentrates energy from multiple mirrors in a column (or row) to point in the image and the entire two-dimensional illuminated array forms a narrow line segment 203 that is swept across the workpiece. In one dimension, the anamorphic optics demagnify the illuminated area, for instance, by 2× to 5×, so the a 60 millimeter wide SLM would image onto a line segment 30 to 12 mm long. Along the short dimension, the anamorphic optics strongly demagnify the column of mirrors to focus onto a narrow area such as 3 microns wide, i.e. essentially a single resolved line. Alternatively, the area could be 1 or 5 microns wide or less than 10 microns wide. Focus onto a 3 micron wide area could involve an 80× demagnification, from approximately 240 microns to 3 microns. The anamorphic optical path demagnifies the row of mirrors to an extent that individual mirrors are combined and not resolved at the image plane. As described in related applications, the SLM could be positioned in a plane that is in sharp focus along one dimension of the SLM and de-focused along the other dimension. This would decrease the criticality of the lens system.

A rotor enables many image processing instruments to be used on large flat substrates and scanning at high speed, e.g. on solar panels, display substrates, sheet metal, architectural glass, roll-to-roll plastic, paper, and the like. Through the rotating arms an image may be captured at the periphery and transferred to the hub where a camera or an optical analytical instrument may be situated, e.g. a reflectometer, spectrophotometer, scatterometer, multispectral camera, polarimeter, fluorescence or photo-luminescence instrument. Instruments that are complex, bulky or fragile can be mounted fixed at the hub and still access any point on the surface of, say, a two meter wide thin-film photovoltaic panel passing on a conveyor under the rotor, thereby enabling full-area inspection or analysis at dense grids on large workpieces without removing sheets for analysis or stopping the roll-to-roll flow. The rotor may have only flat optics or it may have reflecting relays in the arms, allowing achromatic use from far IR to deep UV. The illumination, e.g. UV for fluorescence studies, may be brought from the hub or it may be generated within the rotor.

As mentioned above, the disclosed technology enables many instruments to be used on large flat substrates and scanning at high speed, e.g. on solar panels, display substrates, sheet metal, architectural glass, roll-to-roll plastic, paper, and the like. Through the rotating arms an image may be captured at the periphery and transferred to the hub where a camera or detector (e.g., a vidicon, CCD, CID, CMOS device, and/or a TDI, intensified, gated, avalanche, single photon, photon-counting, interferometric, colorimetric, heterdyne, photoconductive or bolometric detector or array) is located, or an optical analytical instrument may be situated, (e.g., a reflectometer, spectrophotometer, colorimeter, scatterometer, multispectral camera, polarimeter, or a fluorescence, photo-luminescence or photoacoustic instrument).

Other possible uses are for optical measurements of heat (infrared emission), color, flatness, smoothness, film thickness, chemical composition, cleanliness, or for verification of pattern integrity or fidelity. The method is particularly beneficial where an image of the surface or an exact location of a found defect or feature is needed. Instruments that are complex, bulky or fragile can be mounted fixed at the hub and still access any point on the surface of, say, a two meter wide thin-film photovoltaic panel passing on a conveyor under the rotor, thereby enabling full-area inspection or analysis at dense grids on large workpieces without removing sheets for analysis or stopping the roll-to-roll flow. The rotor may have only flat optics or it may have reflecting relays in the arms, allowing achromatic use from far IR to deep UV. The illumination (e.g. visible incident light for reflected-light microscopy) may be brought from the hub or it may be generated within the rotor. Several instruments and or writing modes may be combined in one rotor, either by being combined in one optical arm or by employing different ones. At least one instrument or optical image device may emit an exciting beam through an arm and receives an image back from the workpiece, e.g. UV for fluorescence studies. The rotation may be continuous with a constant or varying angular speed or alternatively be driven by in a stop and go fashion, in particular for random-access analysis of workpieces. Focusing of the imaging optics may be fixed, variable from time to time or dynamic during scanning and based on feedback from focus sensors based on interferometry, back-reflection, proximity to a fiber end, optical triangulation, optical defocus or parallax; fluid flow, pressure or viscous resistance; ultrasound time-of-flight or phase; capacitance, inductance or other suitable phenomena indicating a distance or position.

Some Particular Embodiments

The technology disclosed may be practiced as a method or device adapted to practice the method. The technology may be an article of manufacture such as media impressed with logic to carry out computer-assisted method or program instructions that can be combined with hardware to produce a computer-assisted device.

One embodiment is a method of transforming pattern data used to control exposing radiation to compensate for varying overlap between adjoining printed stripes. A tapered aperture is represented by a first taper function. The interaction between the tapered aperture and a variable overlap between adjoining stripes is represented by a second varying taper function that varies with the variable overlap. The pattern data used to control exposure of at least one stripe is transformed using a computer to apply a combination of the first taper function and the second varying taper function to the pattern data and outputting to memory transformed pattern data.

Some implementations further include retrieving data that represents positions of the adjoining stripes from memory and calculates the second varying taper function from at least the positions. Alternatively, the retrieved data could represent overlap of the adjoining stripes from memory and calculate the second varying taper function from at least the overlap.

One aspect of the technology disclosed, applicable to any of the embodiments above, further includes retrieving data representing distortion of a workpiece from memory and calculating the second varying taper function from at least the distortion.

Another aspect of the technology disclosed includes retrieving data representing a position or angle of a rotating arm from memory and calculating the second varying taper function from at least the overlap.

Another method embodying the present invention further includes retrieving data representing which among a plurality of rotating arms will be used to write the transformed pattern data and calculating the second varying taper function from at least the rotating arm used. The identity of an arm typically will be accompanied by a parameter that relates this arm to a normal or to the preceding or next arm in the sample progression. The aspects of the methods above may generally be combined with this method.

In another embodiment, the second varying taper function is calculated in real time as the transformed pattern data is used to control the exposure. This embodiment may, of course, be combined with other aspects of the methods.

Any of the methods described above or aspects of the methods may be embodied in a pattern transformation device that compensates for varying overlap between adjoining printed stripes. The pattern transformation device includes a memory, a first filter representing a tapered aperture stored in the memory, at least one processor coupled to said memory, a first module running on the processor that updates a second variable overlap filter according to overlap between adjoining stripes of pattern data and a second module running on the processor that combines the first second filters to transform pattern data to compensate for the overlap between the adjoining stripes and output the transformed pattern data.

In one embodiment, data represents positions of the adjoining strips in the memory. The first module retrieves data representing the positions and updates the second variable overlap filter using at least the positions data. Alternately, data representing an overlap of the adjoining stripes in the memory includes the first module retrieving data representing the overlap and updating the second variable overlap filter using at least the overlap data.

In another embodiment, data in the memory representing distortion of a workpiece includes the first module retrieving data representing the distortion of the workpiece and updating the second variable overlap filter using at least the distortion data.

One aspect of the invention includes a third module running on the processor that retrieves data representing a position or angle of a rotating arm, wherein the first module updates the second filter using at least the rotating arm data.

Another aspect of the invention includes, an arm used sensor coupled to the processor, wherein the first module updates the second variable overlap filter using at least arm used data from the arm used sensor.

In yet another embodiment, the first module updates the second variable overlap filter as the second module transforms the pattern data and outputs the transformed pattern data.

While the present invention is disclosed by reference to the preferred embodiments and examples detailed above, it is understood that these examples are intended in an illustrative rather than in a limiting sense. Computer-assisted processing is implicated in the described embodiments, implementations and features. Accordingly, the disclosed technology may be embodied in methods for reading or writing a workpiece using at least one optical arm that sweeps an arc over the workpiece, systems including logic and resources to carry out reading or writing a workpiece using at least one optical arm that sweeps an arc over the workpiece, systems that take advantage of computer-assisted control for reading or writing a workpiece using at least one optical arm that sweeps an arc over the workpiece, media impressed with logic to carry out, data streams impressed with logic to carry out reading or writing a workpiece using at least one optical arm that sweeps an arc over the workpiece, or computer-accessible services that carry out computer-assisted reading or writing a workpiece using at least one optical arm that sweeps an arc over the workpiece. It is contemplated that modifications and combinations will readily occur to those skilled in the art, which modifications and combinations will be within the spirit of the disclosed technology and the scope of the following claims.

We claim as follows:

1. A method of transforming pattern data used to control exposing radiation to compensate for varying overlap between adjoining printed stripes, the method including:
   representing a tapered aperture by a first taper function;
   representing interaction between the tapered aperture and a variable overlap between adjoining stripes by a second varying taper function that varies with the variable overlap;
   wherein the second varying taper function takes into account which particular arm among a plurality of rotating arms will be used to write the transformed pattern data: and
   transforming pattern data that is used to control exposure of at least one stripe, using a computer to apply a combination of the first taper function and the second varying taper function to the pattern data and outputting to memory transformed pattern data.

2. The method of claim 1, further including retrieving data representing positions of the adjoining stripes from memory and calculating the second varying taper function from at least the positions.

3. The method of claim 1, further including retrieving data representing overlap of the adjoining stripes from memory and calculating the second varying taper function from at least the overlap.

4. The method of claim 1, further including retrieving data representing distortion of a workpiece for memory and calculating the second varying taper function from at least the distortion.

5. The method of claim 1, further including retrieving data representing a position or angle of a rotating arm from memory and calculating the second varying taper function from at least the overlap.

6. The method of claim 1, further including calculating the second varying taper function in real time as the transformed pattern data is used to control the exposure.

7. A pattern transformation device that compensates for varying overlap between adjoining printed stripes, the pattern transformation device including:
   a memory;
   a first filter representing a tapered aperture stored in the memory;
   at least one processor coupled to said memory;
   a first module running on the processor that updates a second variable overlap filter according to overlap between adjoining stripes of pattern data;
   a second module running on the processor that combines the first and second filters to transform pattern data to compensate for the overlap between the adjoining stripes and output the transformed pattern data; and
   a third module running on the processor that retrieves data representing a position or angle of a rotating arm, wherein the first module updates the second filter using at least the rotating arm data.

8. The device of claim 7, further including data in the memory representing positions of the adjoining strips, wherein the first module retrieves data representing the positions and updates the second variable overlap filter using at least the positions data.

9. The device of claim 7, further including data in the memory representing overlap of the adjoining stripes, wherein the first module retrieves data representing the overlap and updates the second variable overlap filter using at least the overlap data.

10. The device of claim 7, further including data in the memory representing distortion of a workpiece, wherein the first module retrieves data representing the distortion of the workpiece and updates the second variable overlap filter using at least the distortion data.

11. The device of claim 7, further including an arm used sensor coupled to the processor, wherein the first module updates the second variable overlap filter using at least arm used data from the arm used sensor.

12. The device of claim 7, wherein the first module updates the second variable overlap filter as the second module transforms the pattern data and outputs the transformed pattern data.

* * * * *